US006844845B1

(12) United States Patent
Whiteside et al.

(10) Patent No.: US 6,844,845 B1
(45) Date of Patent: Jan. 18, 2005

(54) WATERPROOF COMBINED GLOBAL POSITIONING SYSTEM RECEIVER AND TWO-WAY RADIO AND METHOD OF WATERPROOF ENCLOSURE FABRICATION

(75) Inventors: John B. Whiteside, Lenexa, KS (US); David Lammers-Meis, Prairie Village, KS (US)

(73) Assignee: Garmin Ltd. (KY)

( * ) Notice: Subject to any disclaimer, the term of this patent is extended or adjusted under 35 U.S.C. 154(b) by 0 days.

(21) Appl. No.: 10/337,024

(22) Filed: Jan. 6, 2003

(51) Int. Cl.[7] .................................................. G01S 5/14
(52) U.S. Cl. ..................................... 342/357.1; 455/347
(58) Field of Search ......................... 342/357.1, 357.08; 455/347, 90.3; 379/440

(56) References Cited

U.S. PATENT DOCUMENTS

| | | | |
|---|---|---|---|
| 5,258,592 A | 11/1993 | Nishikawa et al. | 200/302.2 |
| 5,334,799 A | 8/1994 | Naito et al. | 174/17 |
| 5,517,199 A * | 5/1996 | DiMattei | 342/357.09 |
| 5,526,526 A * | 6/1996 | Clark et al. | 455/90.3 |
| 5,814,765 A | 9/1998 | Bauer et al. | 174/50.54 |
| 6,011,510 A * | 1/2000 | Yee et al. | 342/357.09 |
| 6,373,430 B1 | 4/2002 | Beason et al. | 342/357.09 |
| 6,414,629 B1 * | 7/2002 | Curcio | 342/357.08 |
| 6,492,941 B1 | 12/2002 | Beason et al. | 342/357.1 |
| 6,646,864 B2 * | 11/2003 | Richardson | 361/681 |
| 2003/0034881 A1 * | 2/2003 | Linnett et al. | 340/309.15 |
| 2003/0107516 A1 * | 6/2003 | Hansmann et al. | 342/357.08 |
| 2003/0135326 A1 * | 7/2003 | Brown | 701/213 |

FOREIGN PATENT DOCUMENTS

EP 0752450 A1 * 1/1997 .......... C08L/83/07

OTHER PUBLICATIONS

GARMIN rino series, Sneak Peak– Get the Safety of GPS with the Convenience of a 2–way Radio, copyright 2001. 2 pages.*

* cited by examiner

Primary Examiner—Gregory C. Issing
(74) Attorney, Agent, or Firm—Devon A. Rolf

(57) ABSTRACT

A combined global positioning system receiver and two-way radio communications unit (GPS/radio unit) that is configured for wirelessly communicating with one or more other such units and that includes a substantially waterproof enclosure for protection of the electronic components contained therein is provided. The substantially waterproof enclosure includes first and second cooperatively mated housing sections which, when mated, form an internal compartment or chamber for enclosing electronic components of the GPS/radio unit. The waterproof enclosure may further include a cover positioned over a plurality of tubular structures which protrude from a top end wall of the second housing section. Also provided is a method of waterproofing a GPS/radio unit including a number of different techniques for waterproofing different features and elements of the enclosure.

50 Claims, 9 Drawing Sheets

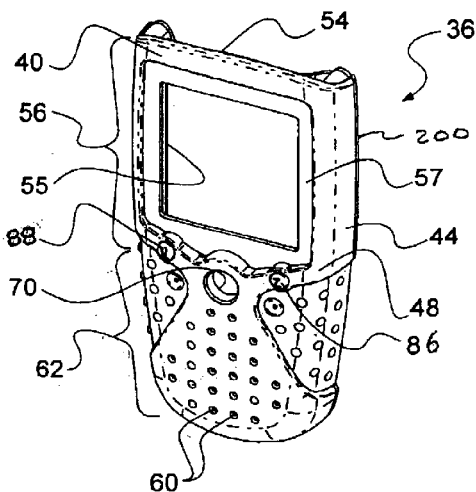
FIG. 4
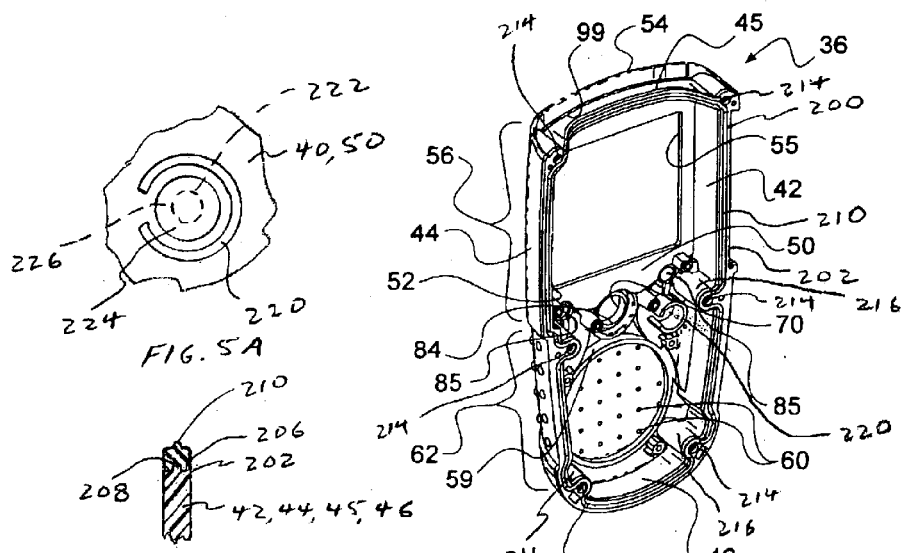
FIG. 5A
FIG. 5B
FIG. 5

WATERPROOF COMBINED GLOBAL POSITIONING SYSTEM RECEIVER AND TWO-WAY RADIO AND METHOD OF WATERPROOF ENCLOSURE FABRICATION

BACKGROUND OF THE INVENTION

1. Field of Invention

The present invention relates generally to a combined global positioning system receiver and radio unit. More specifically, the present invention relates to a combined global positioning system navigation unit and two-way radio communications unit that includes a substantially waterproof enclosure for protection of the electronic components contained therein, and method of fabrication of the substantially waterproof enclosure.

2. State of the Art

A global positioning system (GPS) is an electronic satellite navigation system that permits a user of the system to determine his or her position with respect to the Earth. Global positioning may be accomplished through the use of a handheld GPS receiver device that detects and decodes signals from a number of satellites orbiting the Earth. The signals from each of these satellites indicate the position of the satellite and the time at which the signal was sent. To decode the satellite signals, known as spread spectrum signals, and thereby calculate the desired navigational data, a GPS receiver must first "find" or acquire the signals emitted from a minimum number of satellites. Once the receiver is "locked on" to the spread spectrum signals, continuous real-time calculation and monitoring of the user's global position and other navigational data (e.g., velocity of movement) may be performed.

GPS receivers have clocks that are synchronized with clocks in each of the satellites to determine how long it takes the signals to travel from the satellites to the receiver. In this regard, GPS receivers require a highly accurate internal frequency reference in order to acquire the spread spectrum GPS satellite signals. Specifically, acquiring spread spectrum satellite signals from a sufficient number of satellites to perform calculations requires determining the frequency of oscillation of the crystal oscillator utilized in the GPS receiver.

Once the GPS receiver has acquired and decoded signals from a minimum of three satellites, the GPS receiver can calculate the user's position (i.e., latitude and longitude) by geometric triangulation. Upon acquiring signals from a minimum of four satellites, the GPS receiver can also calculate the user's altitude. In addition, GPS receivers are able to calculate the user's speed and direction of travel by continuously updating the user's position. Accordingly, GPS receivers are highly valuable and widely used in navigational systems because of their ability to accurately compute the user's position on or near the Earth in real-time, even as the user is moving.

In addition to the growing popularity and demand for GPS navigational devices, portable two-way radios continue to enjoy widespread popularity. In 1996, the Federal Communications Commission (FCC) established the Family Radio Service (FRS) so that families and other small groups could communicate with one another over very short distances (typically less than one mile) at no charge and without an FCC license. The FRS, which is one of the Citizens Band Radio Services, includes fourteen channels in the UHF 460 MHz band. There are a number of commercially available two-way radios that are designed for use with the FRS. The increasing use of both portable two way radios and global positioning systems has led to proposals to incorporate GPS receivers into portable radio devices.

The first combined portable GPS receiver and two-way radio unit that is capable of displaying the location of at least one other such unit (as well as its own location) was recently developed by Garmin International, Inc. of Olathe, Kans. and is described in U.S. Pat. No. 6,373,430 (hereinafter the "'430 patent"). The combined global positioning system receiver and two-way radio unit of the '430 patent is capable of communicating with one or more other such units over a wireless radio network, wherein each of the units is adapted to transmit over the network radio signals indicative of that unit's location. The GPS/radio unit includes a GPS receiver for receiving satellite signals from a plurality of satellites, a processor coupled with the GPS receiver for calculating the location of the GPS/radio unit as a function of the received satellite signals, and a radio receiver coupled with the processor for receiving the radio signals transmitted by the other units. The processor is adapted to identify the location of the other units based upon the received radio signals. The GPS/radio unit also includes a display for indicating its own location as well as the location of at least one of the other units. The disclosure of the '430 patent is hereby incorporated herein by this reference as if set forth in its entirety.

The GPS/radio unit of the '430 patent includes a portable, handheld housing for housing the unit electronic components, e.g., the GPS receiver, the processor, the radio receiver and the display. However, the electronic components contained within the housing are vulnerable to potential harmful effects which may be caused by ingress of water (or other liquid) through the housing. Such ingress is of concern if the GPS/radio unit is dropped into a puddle, pond, river, stream or other body of water, if water or other liquid is splashed onto the GPS/radio unit, or if the user of the GPS/radio unit is caught in inclement weather such as rain or snow.

Thus, the inventors have recognized that it would be advantageous to provide a combined two-way radio communications unit and GPS navigation unit configured for wirelessly communicating with one or more other such units and which includes a substantially waterproof enclosure for protecting the electronic components housed therein from the potentially harmful effects of liquid ingress. It would be further advantageous to provide such substantially waterproof enclosure in a compact, robust yet relatively inexpensive form, the components of which are easy to fabricate and assemble.

BRIEF SUMMARY OF THE INVENTION

The present invention includes a combined global positioning system receiver and two-way radio communications unit (GPS/radio unit) that includes a substantially waterproof enclosure for protection of the electronic components contained therein. The GPS/radio unit is configured for wirelessly communicating with at least one other such GPS/radio unit over a wireless radio network, the at least one other GPS/radio unit being configured for transmitting radio signals indicative of that unit's location. The GPS/radio unit includes a global positioning system receiver for receiving satellite signals from a plurality of satellites, a processor coupled with the global positioning system receiver for calculating the location of the GPS/radio unit as a function of the received satellite signals, and a radio transceiver coupled with the processor for receiving the radio signals transmitted by the at least one other GPS/radio unit and for transmitting a radio signal to the at least one other GPS/radio unit. The transmitted radio signal is indicative of a location of the GPS/radio unit. The processor is configured to identify the location of the at least one other GPS/radio unit based upon the received radio signals. The GPS/radio unit also includes a display for indicating the location of at least one of the other GPS/radio units and a substantially waterproof enclosure for housing the global positioning system receiver, the processor, the radio transceiver and the display.

The present invention further encompasses a substantially waterproof enclosure for a combined global positioning system receiver and two-way radio communications unit (GPS/radio unit). The substantially waterproof enclosure includes a first housing section and a second housing section configured to cooperatively mate with one another in a water tight relationship. The waterproof enclosure may further include a cover configured to be positioned over a plurality of tubular structures which protrude upwardly from a top end wall of the second housing section. The cover includes a body portion which may be received in a cavity formed upon cooperatively coupling the first and second housing sections to one another.

Still further, the present invention encompasses a method for fabricating a substantially waterproof enclosure for a combined global positioning system navigation unit and two-way radio communications unit (GPS/radio unit). The method comprises forming the first and second housing sections, preferably by molding. The first housing section is then subjected to a second molding operation wherein an elastomer may be selectively placed to provide elastomeric covers over apertures at locations of movable user input elements to be carried by the GPS/radio unit and to provide an elastomeric gasket along a peripheral edge of the first housing section to be placed and compressed against a cooperatively configured peripheral edge of the second housing section upon assembly of the two housing sections. The method further comprises disposing components of a GPS/radio unit that is configured for wirelessly communicating with at least one other such unit at least partially within an enclosure or section thereof having at least one opening through a wall thereof, and sealing the at least one opening to substantially prevent the ingress of water or other liquid through the at least one opening. The method further comprises placing an elastomeric cover over a portion of the enclosure in an interfering relationship with an outer wall thereof to form a substantially waterproof seal therewith. Additional and more specific aspects of providing waterproofing to different elements and features of the substantially waterproof enclosure, and of forming the housing sections of the waterproof enclosure, are also disclosed herein and encompassed by the present invention.

BRIEF DESCRIPTION OF THE DRAWINGS

The foregoing features and advantages of the invention will be apparent from the following description and apparent from the accompanying drawings, in which like reference characters refer to the same or similar parts throughout the different views. The drawings illustrate principles of the invention and, although not necessarily to scale, show relative dimensions.

FIG. 4 is a front perspective view of the first housing section of a two section waterproof enclosure in accordance with the present invention;

FIG. 5 is a rear perspective view of the first housing section of FIG. 4, FIG. 5A is an enlarged elevation of the location thereon wherein a microphone is to be placed and FIG. 5B is an enlarged cross sectional view of a peripheral edge of a portion of the first housing section and an elastomeric gasket formed thereon;

DETAILED DESCRIPTION OF THE INVENTION

The present invention is directed to a combined global positioning system receiver and two-way radio communications unit that is configured for wirelessly communicating with one or more other such units and that includes a waterproof enclosure for protection of the electronic components contained therein. The particular embodiments described herein are intended in all respects to be illustrative rather than restrictive. Additional embodiments will become apparent to those of ordinary skill in the art to which the present invention pertains without departing from its scope.

Figure 1:
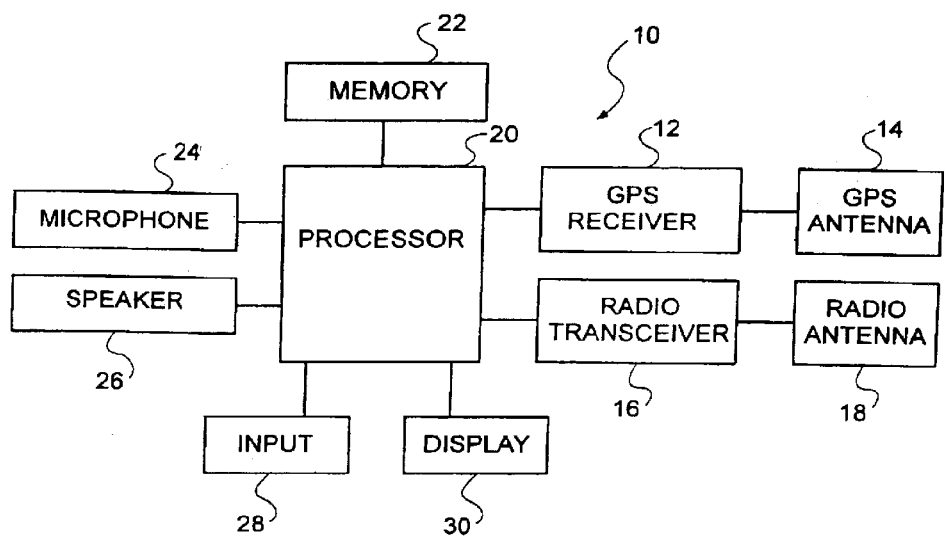
FIG. 1 is a block diagram of the components of an exemplary combined global positioning system receiver and two-way communications unit (GPS/radio unit)

Referring to the figures in general, and initially to FIG. 1 in particular, a block diagram of the electronic components of an exemplary combined global positioning system and two-way radio communications unit (GPS/radio unit) is illustrated. The combined GPS/radio unit is denoted generally by reference numeral 10, and is sized and configured as a handheld unit. The GPS/radio unit 10 includes a GPS receiver 12, a GPS antenna 14, a radio transceiver 16 and a radio antenna 18. The GPS receiver 12 and radio transceiver 16 are electronically coupled with a processor 20 that has an associated memory 22 for storing information such as cartographic data (e.g., electronic maps). The cartographic data may be stored on cartridges that can be removably attached and operably coupled to the unit. For example, an electronic map of a particular city or national park may be stored in a single cartridge. The memory 22 may also store historical location data for the GPS/radio unit 10 or for other units that have transmitted location data to the unit 10.

The combined GPS/radio unit 10 also includes a microphone 24, a speaker 26, a user input 28 and a display 30. It is currently preferred that the display 30 comprises a liquid crystal display (LCD). Further, it is currently preferred that the user input 28 comprises a five-way cursor for accessing data and navigating within a menu-driven display program. However, it will be understood and appreciated by those of ordinary skill in the art that the user input 28 may comprise an alphanumeric keypad, such as a telephone keypad, which may be used to select and input a name or other identifier for the unit using any combination of the letters, numbers, or symbols which are available on the keypad. Additionally, the user input 28 may comprise a microphone/voice recognition input, touch screen, or any other user input 28 known to those of ordinary skill in the art. All such variations are contemplated to be within the scope of the present invention. When the GPS/radio unit 10 is assembled, it is currently preferred that the user input 28 is generally centrally located within aperture 70 with respect to the exterior surface 48 of the front wall 40 (see FIG. 4) of the first housing section 36 of the GPS/radio unit 10 to facilitate one-handed user operation, as more fully described below.

Figure 2:
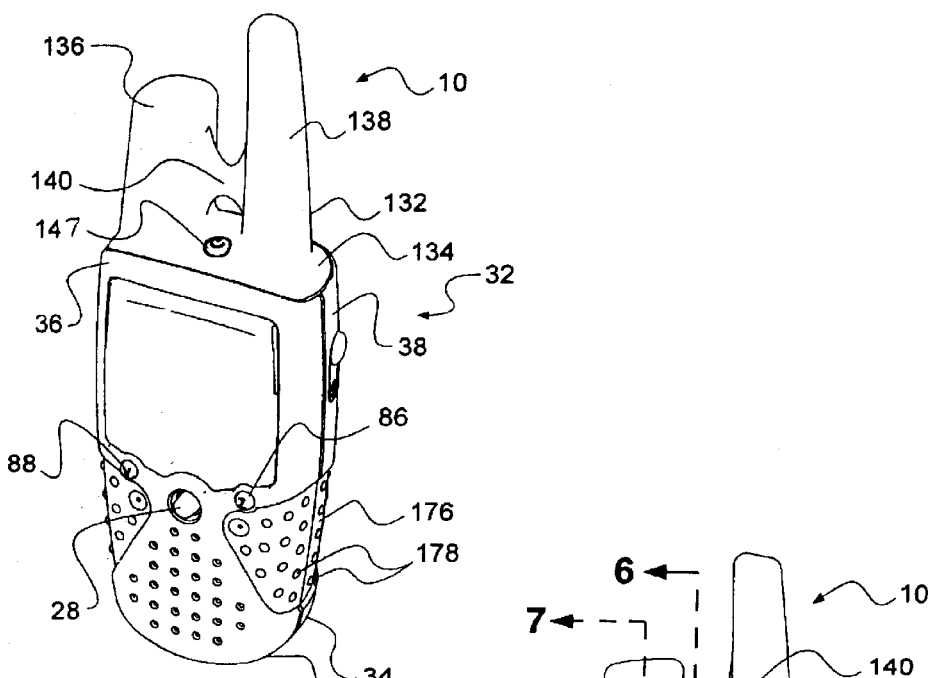
FIG. 2 is a front perspective view of an exemplary, assembled GPS/radio unit in accordance with the present invention, which combined GPS/radio unit includes a waterproof enclosure for protection of the electronic components contained therein.

Referring now to FIG. 2, the GPS/radio unit 10 of the present invention includes a waterproof enclosure 32 for housing the internal components thereof and protecting the same from the potential harmful effects of water ingress. As used herein, the term "water" encompasses and includes not only water per se, but also any other liquid, and is not limited to such substances in a liquid state but also in a vapor state. The illustrated waterproof enclosure 32 includes a two-section plastic housing 34 and a flexible elastomeric cover 132 positioned to cover an uppermost region of the two-section plastic housing 34, as more fully described below. The two-section plastic housing 34 is comprised of a first housing section 36 and a second housing section 38. When the GPS/radio unit 10 is assembled, the first and second housing sections 36, 38 fit together in a water tight, cooperatively mated relationship to define an internal compartment or chamber in which the internal electronic components of the GPS/radio unit 10 (e.g., the GPS receiver 12, the processor 20, the radio transceiver 16, the radio antenna 18, the GPS antenna 14 and the display 30, as illustrated in FIG. 1) may be enclosed and protected. Fabrication of the first and second housing sections 36 and 38 and assembly of the GPS/radio unit 10 is more fully described below.

Referring to FIGS. 4 and 5, the first housing section 36 of the two-section plastic housing 34 is shown. The first housing section 36 includes a front wall 40, first and second side walls 42, 44, a top wall 45 and a bottom wall 46. An exterior surface 48 of the front wall 40 is visible from the front of the GPS/radio unit 10 when the GPS/radio unit 10 is assembled. An interior surface 50 of the front wall 40, the side walls 42, 44, the top wall 45 and the bottom wall 46 forms an interior cavity 52 within which a number of the internal electronic components of the GPS/radio unit 10 may be positioned. When cooperatively mated with the second housing section 38, as more fully described below, the interior cavity 52 of the first housing section 36 and an interior cavity 97 of the second housing section 38 cooperate with one another to form a substantially water tight internal compartment wherein the internal components of the GPS/radio unit 10 may be enclosed.

To elaborate on the fabrication of first and second housing sections 36 and 38, each housing section 36, 38 is preferably formed as a single-piece rigid plastic component by injection molding, although other suitable molding techniques may be employed. A polycarbonate is currently preferred as the material for first and second housing sections 36 and 38. The first, or front, housing section may be formed in a two part molding operation wherein the rigid plastic component formed in a first mold is placed in a second mold and an elastomer is selectively injected to into a cavity defined over peripheral edge 202 of first housing section 36 to form an elastomeric gasket 200 extending along the peripheral edge 202 of first housing section 36 which will engage a cooperatively configured peripheral edge 204 of second, or rear, housing section 38. Elastomeric gasket 200 may best be seen in FIGS. 4, 5 and 5B. A currently preferred material for elastomeric gasket 200 is a styrenic thermoplastic elastomer. As shown in enlarged detail in FIG. 5B, elastomeric gasket 200 is formed over, and in alignment with, peripheral edge 202, which includes a flat 206 and a protrusion 208 extending therealong in the center of peripheral edge 202. Elastomeric gasket 200 is formed with a small seal bead 210 protruding upwardly therefrom. Seal bead 210 is compressed against, and seals with, a polished, flat surface comprising peripheral edge 204 of second housing section 38 upon assembly of the first and second housing sections 36 and 38.

The second part of the molding operation may also be used to form elastomeric covers 86 and 88 over apertures 85 in front housing section 36, the elastomeric covers 86 and 88 being adhered in place within the outward ends of apertures 85 during the molding thereof. The second part of the molding operation for first housing section 36 may further be used to form a portion of optional gripping region 176 which, as illustrated, may be contiguous with elastomeric gasket 200 or which may be discrete and separate therefrom. Likewise, another portion of optional gripping region 176 may be formed on second housing section 38 in a second of a two part molding operation performed thereon.

The top wall 45 of the first housing section 36 and the portion of each side wall 42, 44 proximate the top wall 45 include a continuous, upwardly extending ridge 54 protruding therefrom. The upwardly extending ridge 54 is molded to be coextensive with the exterior surface 48 of the front wall 40 and the side walls 42, 44. As more fully described below, the second housing section 38 also includes a continuous ridge 93 extending upwardly from a top end wall 96 and side walls 92, 94 thereof. When assembled, the two upwardly extending ridges 54, 93 cooperate with one another to form a cavity 99 (portions of cavity 99 depicted in FIGS. 5 and 9) in which the body portion 134 of the flexible elastomeric cover 132 which protects the GPS and radio antennas 14 and 18, respectively, from impact damage and water ingress may be received, as more fully described below.

Figure 6:
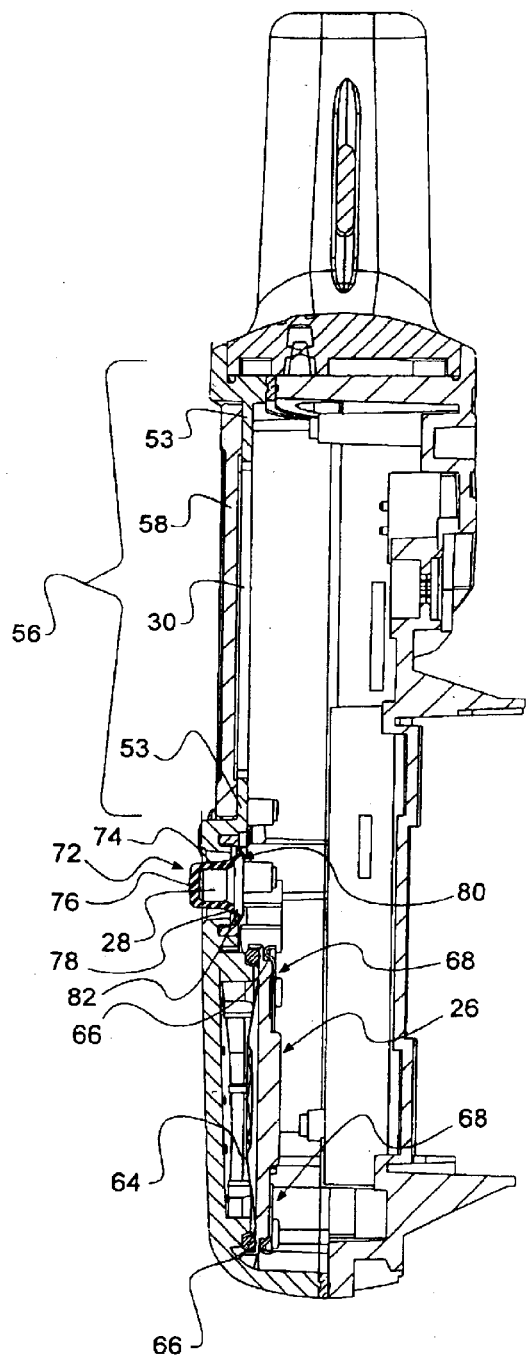
FIG. 6 is a side cross-sectional view taken along line 6—6 of FIG. 3.

As best seen in FIG. 6, one such component positioned within the interior cavity 52 of the first housing section 36 is the display 30. The front wall 40 of the first housing section 36 includes an opening 55 (FIG. 5) therein sized and shaped to enable viewing of the display 30 therethrough, the display 30 typically being slightly recessed from the plane of the exterior surface 48 of the front wall 40. It is currently preferred that the opening 55 in the front wall 40 and the display 30 are positioned with respect to the exterior surface 48 of the front wall 40 off center toward an upper region 56 thereof as shown.

Still referring to FIG. 6, a transparent plastic lens 58 is positioned over the surface of the display 30 which is exposed through the opening 55 in the front wall 40 proximate the exterior surface 48 thereof, as well as over the portion 57 of the exterior surface 48 of the front wall 40 which surrounds the display 30. The transparent plastic lens 58 includes a shape similar to that of the display 30 and is slightly larger than the display 30. That is, the transparent plastic lens 58 extends beyond the display 30 around an outer periphery thereof and is secured to the portion 57 of the exterior surface 48 of the front wall 40 which surrounds the display 30 by a double-sided adhesive element 53. Suitable adhesive elements include an acrylic foam sheet with adhesive on both sides and offered by 3M as product #4920, and a double-sided adhesive element 5000N offered by Nitto-Denko. In this manner, the periphery of the transparent plastic lens 58 forms a water tight seal with the exterior surface 48 of the front wall 40, substantially preventing water from contacting the display 30 and thus from entering the internal compartment of the GPS/radio unit 10 through the display opening 55.

Also positioned within the interior cavity 52 of the first housing section 36 are the microphone 24 and the speaker 26 (see FIG. 1) through which a user may communicate with users of other units. To facilitate use of the speaker 26, the front wall 40 of the first housing section 36 includes a number of small openings 60 therethrough (FIGS. 4 and 5). It is currently preferred that the small openings 60 through the front wall 40 are positioned off center toward a lower region 62 thereof as shown, and the speaker 26 correspondingly positioned within the interior cavity 52. To prevent water, from entering the internal compartment of the GPS/radio unit 10 through the small openings 60 in the front wall 40, the cone 64 of speaker 26 is formed of a suitable waterproof material also well adapted to function as a speaker cone, such as MYLAR® polymer. A sealing element in the form of an O-ring or gasket 66 (a foam gasket being currently preferred) is then adhered to an annular protrusion 59 on the interior surface 50 of the front wall 40 and a periphery of the cone of speaker 26, which is also mechanically clamped using, e.g., a metal clamp frame 68, to the protrusion 59 (see FIG. 6). In this manner, the metal clamp frame 68 latches over the O-ring or gasket 66, pressing against a periphery of the cone of speaker 26 and a water tight seal is formed using the material of the speaker cone 64 as a water-impermeable membrane to prevent water from entering the internal compartment of the GPS/radio unit 10. Microphone 24 is mounted to the main printed circuit board (not shown) at a location to be positioned in alignment with, and to be received within, substantially annular skirt 220 on the interior surface 50 of front wall 40 of first housing section 36 (see FIGS. 5 and 5A). Aperture 222 extends through the wall of front housing section within annular skirt 220, and is covered with an air and sound permeable, and water impermeable, hydrophobic patch 224 in the form of a membrane comprising a nonwoven fabric such as, by way of example only, VERSAPORE™ V-5000 R fabric from Gelman Sciences. Hydrophobic patch 224 is secured at its periphery over aperture 222 by a suitable adhesive 226 such as, by way of example only, a 3M product # 468 transfer adhesive.

Substantially centrally located with respect to the front wall 40 of the first housing section 36 is at least one aperture 70 (FIGS. 4 and 5) through which at least one user input 28 (FIG. 6) protrudes toward the exterior surface 48 of the front wall 40. In the illustrated embodiment, the user input 28 comprises a five-way cursor for accessing data and navigating within a menu-driven display program. However, the user input 28 may comprise an alphanumeric pad, microphone/voice recognition input, or the like, as known to those of ordinary skill in the art. The five-way cursor user input 28 illustrated enables navigation in four directions (generally up, down and to each side) by appropriately directed lateral pressure, a selection being made and communicated to the processor 20 by depression of the user input 28.

Referring now to FIGS. 5 and 6, to prevent water from entering the internal compartment of the GPS/radio unit 10 through the at least one aperture 70 (FIG. 5), a flexible elastomeric cover 72 (FIG. 6) may be positioned over the user input 28. The flexible elastomeric cover 72 includes a cup-shaped body portion 74 having a closed top end 76 and an open bottom end 78, the body portion 74 forming a cavity sized and shaped to receive the user input 28. Extending about a periphery of the open bottom end 78 is a flange 80, the terminal end 82 of which is turned upwardly from the plane of the flange 80. Upon assembly, the user input 28 is fitted into the cavity formed by the body portion 74 and the upwardly turned terminal end 82 of the flange 80 is fitted within a groove 84 (FIG. 5) protruding from the interior surface 50 front wall 40 in a resilient, compressed interference fit. In this manner, the flexible elastomeric cover 72 forms a water tight seal with the first housing section 36, substantially preventing water from contacting the user input 28 through the aperture 70 in the front wall 40 and thereby preventing water from entering the internal compartment of the GPS/radio unit 10 through the aperture 70.

Optionally, the front wall 40 of the first housing section 36 may include one or more additional apertures 85 through which one or more control buttons may protrude toward the exterior surface 48 of the front wall 40. In the embodiment shown in FIG. 2, the GPS/radio unit 10 includes two control buttons (not shown) protruding through the front wall 40 of the first housing section 36 and covered by elastomeric covers 86, 88. The first control button covered by elastomeric cover 86 may, for instance, be coupled with the processor 20 so that depressing the first control button causes the GPS/radio unit 10 to immediately transmit a radio signal over the network indicative of the location of the GPS/radio unit 10. Similarly, the second control button covered by elastomeric cover 88 may, for instance, be coupled with the processor 20 so that depressing the second control button causes the GPS/radio unit 10 to immediately transmit a radio signal over the network requesting that users of other units transmit their locations over the network. It will be understood and appreciated by those of ordinary skill in the art that the control buttons may have any number of additional or alternative functions including, but not limited to, power, volume adjustment and the like.

In order to protect the internal compartment of the GPS/radio unit 10 from the ingress of water at the locations of the apertures 85 through which the control buttons may protrude, flexible elastomeric covers 86, 88 may be disposed over the control buttons in a manner similar to that described above with regard to the user input 28 and the corresponding aperture 70 in the front wall 40 of the first housing section 36. Alternatively, those portions of the housing section 36 overlying the control buttons may be made thin-walled and flexible enough to permit depression of the control buttons. However, it is currently preferred, as noted above, that flexible elastomeric covers 86, 88 be molded onto front housing section 36 in a second part of a two-part injection molding operation used to form front housing section 36.

Figure 9:
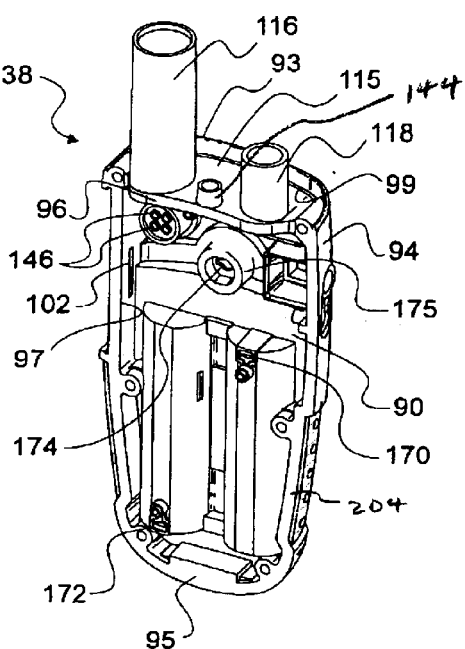
FIG. 9 is a front perspective view of the second housing section of FIG. 8.
Figure 13:
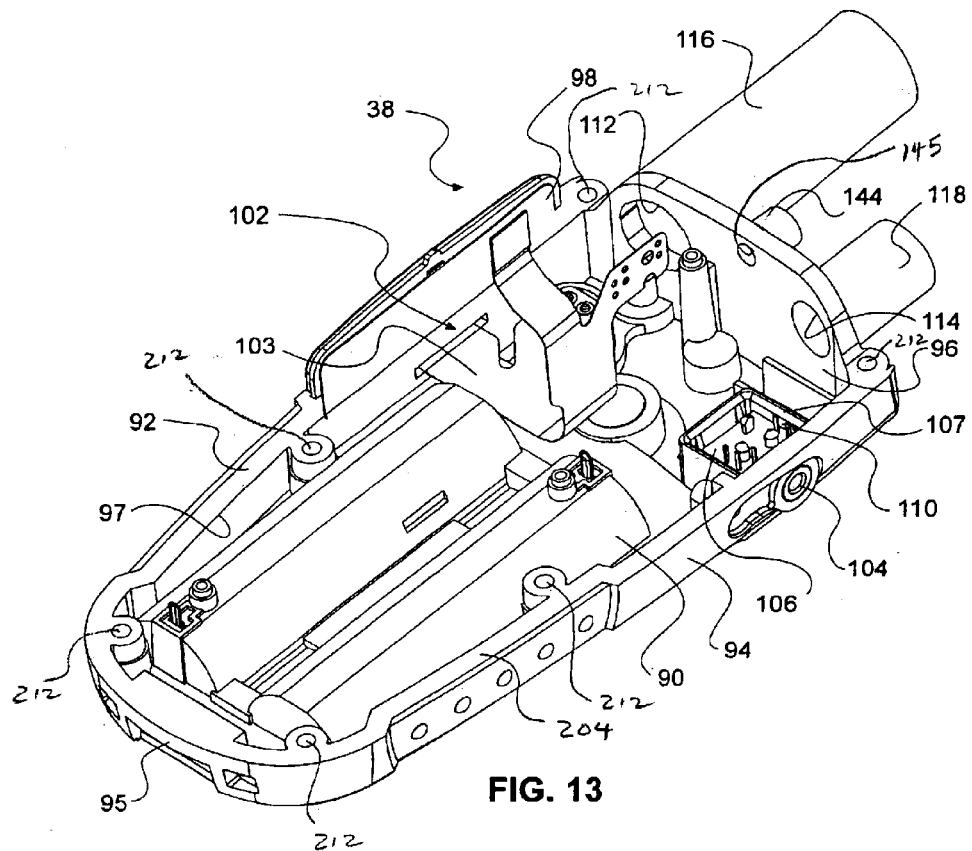
FIG. 13 is a front perspective view of the second housing section of FIG. 8.

Referring now to FIGS. 9 and 13, front perspective views of the second housing section 38 of the two-section plastic housing 34 are shown, the first housing section 36 and electronic components being removed from the GPS/radio unit 10. The second housing section 38 is preferably formed as a single molded component and includes a rear wall 90, first and second side walls 92, 94, a bottom end wall 95 and a top end wall 96. The top and bottom end walls 96, 95 and the first and second side walls 92, 94 form an interior cavity 97 within which a number of the internal electronic components of the GPS/radio unit 10 may be positioned.

The top end wall 96 of the second housing section 38 and the portion of each side wall 92, 94 proximate the top end wall 96 include an upwardly extending ridge 93 (FIG. 9) protruding therefrom. The upwardly extending ridge 93 is molded to be coextensive with the exterior surface 150 of the rear wall 90 of the second housing section 38 and the side walls 92, 94. As more fully described below, when assembled, the upwardly extending ridge 93 of the second housing section 38 cooperates with the upwardly extending ridge 54 of the top wall 45 of the first housing section 36 to form a cavity 99 (portions of cavity 99 illustrated in FIGS. 5 and 9) in which the body portion 134 of the flexible elastomeric cover 132 may be received.

Figure 17:
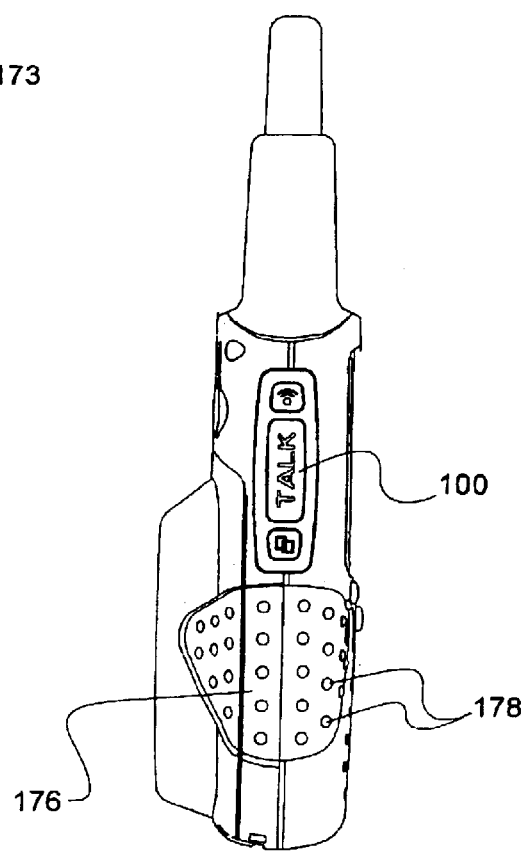
FIG. 17 is a left side elevational view of an assembled GPS/radio unit of FIG. 2.

The first side wall 92 includes an extended portion 98 thereof. As best seen in FIG. 17, the extended portion 98 includes a control button 100 (or "push to talk" button) externally facing therefrom which may be depressed by the user when he or she desires to communicate with the user of another unit. Positioned to correspond with the control button 100 is an elongated slot 102 through the first side wall 92 (FIGS. 9 and 13). Upon assembly, a flex circuit 103 extends from the control button 100 through the elongated slot 102 and into the interior cavity 97. To prevent water from entering the interior cavity 97 and thus the internal compartment of the GPS/radio unit 10 through the elongated slot 102, a bead of room temperature vulcanizing (RTV) sealant is applied at the location of the elongated slot 102. The RTV sealant is typically applied in a viscous liquid or gel-like state and cures at room temperature, creating a flexible elastomeric seal at the point of application. Thus, once the applied RTV sealant cures, a water tight seal is formed about the flex circuit 103 as it passes through the elongated slot 102, preventing water from passing therethrough.

Figure 16:
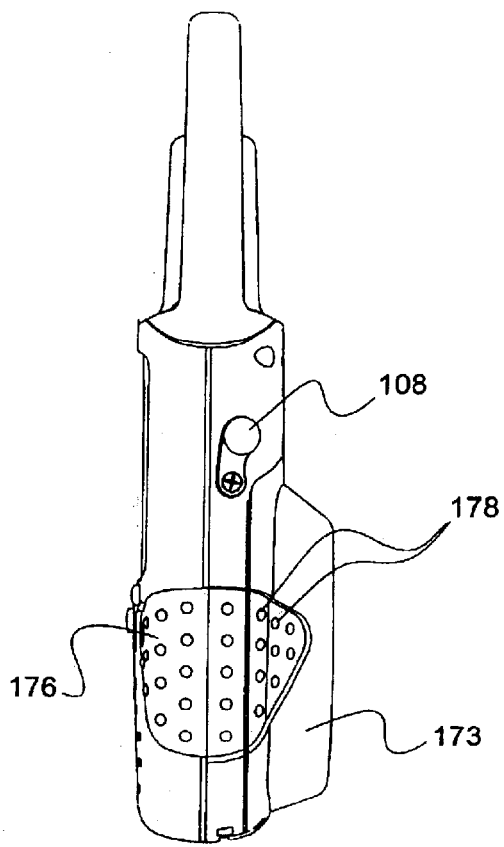
FIG. 16 is a right side elevational view of the assembled GPS/radio unit of FIG. 2.

With reference to FIG. 13, the second side wall 94 of the second housing section 38 includes an aperture 104 therein which is positioned to correspond with an audio jack 106 secured in a jack compartment 107 to the rear wall 90 of the second housing section 38. If desired, an audio component (not shown), e.g., a headset, may be operably coupled with the GPS/radio unit 10 by insertion of a male plug adapter thereof through the aperture 104 in the second side wall 94. As best seen in FIG. 16, a cover 108 including a flexible elastomeric plug for insertion into the aperture 104 may be positioned over the aperture 104 when the audio jack 106 is not in use. When a user desires to utilize the audio jack 106, he or she may simply remove the elastomeric plug from the aperture 104 and insert the male plug adapter provided by the audio component (not shown).

An opening 110 (FIG. 13) in the wall of jack compartment 107 permits communication between the audio jack 106 and the processor 20 (e.g., one or more wires may extend therethrough). While the cover 108 and/or the male plug adapter provided by the audio component (not shown) provide a certain amount of protection from water ingress through aperture 104, to ensure that water may not leak beyond the audio jack 106 through the opening 110 in the wall of the jack compartment 107 and damage the internal components of the GPS/radio unit 10, a dot of RTV sealant is applied at the location of the opening 110 as discussed above with regard to the elongated slot 102 in the first side wall 92.

As best seen in FIG. 13, the top end wall 96 of the second housing section 38 includes at least two apertures 112, 114 therein, the first aperture 112 having a cross-sectional dimension (e.g., diameter if the apertures are round) greater than the cross-sectional dimension of the second aperture 114. Extending from an external surface 115 of the top end wall 96 and positioned to correspond with the apertures 112, 114 is a pair of integral tubular structures 116, 118, access to the interior of the tubular structures 116, 118 being permitted from the interior cavity 97 of the GPS/radio unit 10 through the apertures 112 and 114, respectively. The interior surface of the first tubular structure 116 corresponds in cross-sectional dimension to the first aperture 112 and is shaped to receive the GPS antenna 14 and the interior surface of the second tubular structure 118 corresponds in cross-sectional dimension to the second aperture 114 and is shaped to receive the radio antenna 18.

Figure 3:
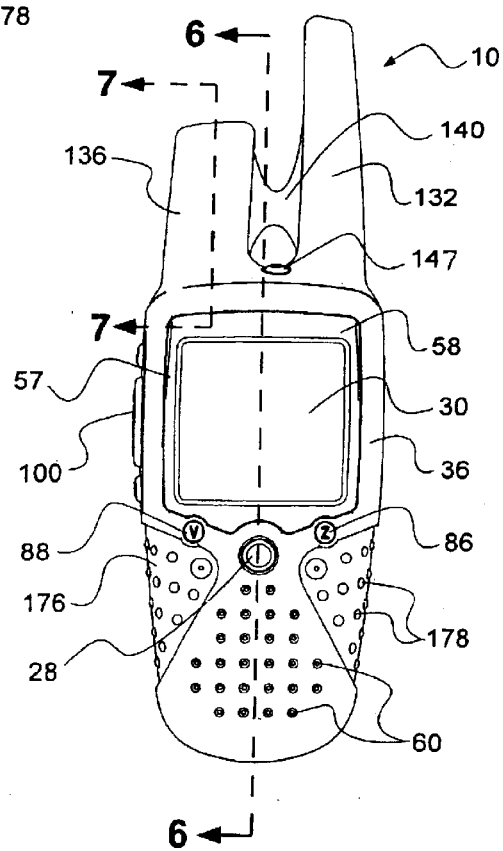
FIG. 3 is a front elevational view of the GPS/radio unit of FIG. 2.
Figure 7:
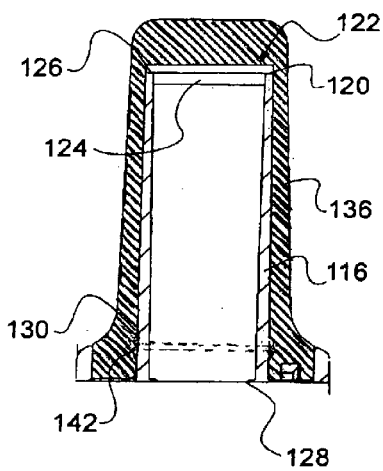
FIG. 7 is a side cross-sectional view taken along line 7—7 of FIG. 3.

Referring now to FIG. 7, a cross-sectional view of the first tubular structure 116, taken along line 7—7 of FIG. 3, is illustrated. It will be understood and appreciated by those of ordinary skill in the art that, while not depicted, the details depicted in FIG. 7 are equally applicable to the second tubular structure 118 as well. The first tubular structure 116 includes an open top end 120 thereof. Positioned proximate the open top end 120 is a cap 122. The cap 122 includes a body portion 124 sized and shaped to fit within the open top end 120 of the first plastic tubular structure 116 and a flange 126. The flange 126 extends around the periphery of the body portion 124 and is of similar shape as the open top end 120 of the first tubular structure 116. However, the flange 126 has greater peripheral dimensions than the open top end 120 such that when the cap 122 is positioned over the open top end 120 of the first tubular structure 116, the body portion 124 thereof fits within the open top end 120 and the flange 126 is prevented from entering the open top end 120. Thus, the cap 122 effectively seals the open top end 120 of the first tubular structure 116.

To prevent the ingress of water into the internal compartment of the GPS/radio unit 10 through the first tubular structure 116, a flexible elastomeric cover 132 is positioned over the first tubular structure 116. As best seen in FIG. 2, it is currently preferred that the flexible elastomeric cover 132 be provided as a single element having a body portion 134, a first tubular portion 136, a second tubular portion 138 and a connector portion 140. The connector portion 140 extends between the first and second tubular portions 136, 138 and provides structural integrity to the flexible elastomeric cover 132. The first tubular portion 136 is sized and shaped to receive the first tubular structure 116 and the second tubular portion 138 is sized and shaped to receive the second tubular structure 118.

Referring again to FIG. 7, the first tubular portion 136 includes an annular protrusion 142 extending from an interior surface thereof, the inner diameter of annular protrusion 142 being sized slightly smaller than the exterior surface the first plastic tubular structure 116. Thus, when the first tubular portion 136 is positioned over the first tubular structure 116, the annular protrusion 142 from the first tubular portion 136 bears against the exterior surface of the first tubular structure 116, forming a flexible elastomeric ring that seals the first tubular structure 116 from the ingress of water. It will be understood by those of ordinary skill in the art that, while not depicted in the drawing figures, a similar flexible elastomeric seal is formed upon positioning the second tubular portion 138 over the second tubular structure 118 as well.

Optionally, the top end wall 96 of the second housing section 38 may include one or more additional integral tubular structures 144 defining one or more openings 145 sized and shaped to receive a power indicator light, a power button, or the like. In the embodiment illustrated in FIG. 13, one such additional tubular structure 144 is shown, tubular structure 144 providing access to a power button or other switch element (not shown) accessible at the top thereof. It will be understood by those of ordinary skill in the art that there would also be a corresponding flexible segment 147 (FIG. 2) molded in the body portion 134 of the flexible elastomeric cover 132 permitting necessary, tactile access to the indicator button or other switch element. A seal may be effected between flexible elastomeric cover 132 and plastic tubular structure 144 in a manner similar to that described with respect to first plastic tubular structure 116, e.g., through use of an annular protrusion on an interior portion of elastomeric cover 132 configured to fit over tubular structure 144.

Figure 8:
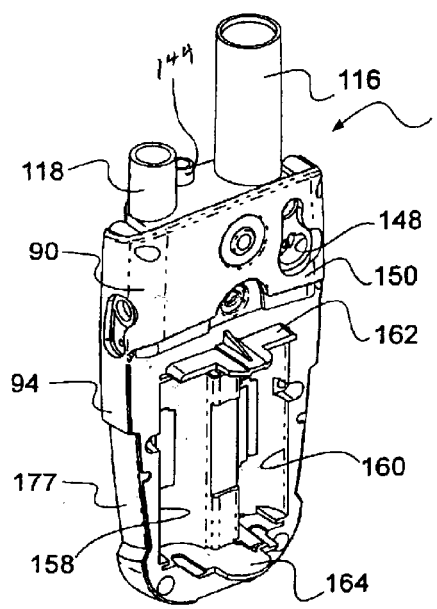
FIG. 8 is a rear perspective view of the second housing section of the two section waterproof enclosure in accordance with the present invention.
Figure 15:
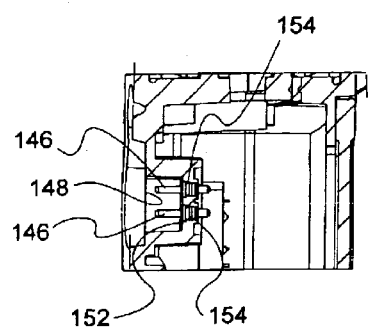
FIG. 15 is across-sectional view taken along line 15—15 of FIG. 14.
Figure 14:
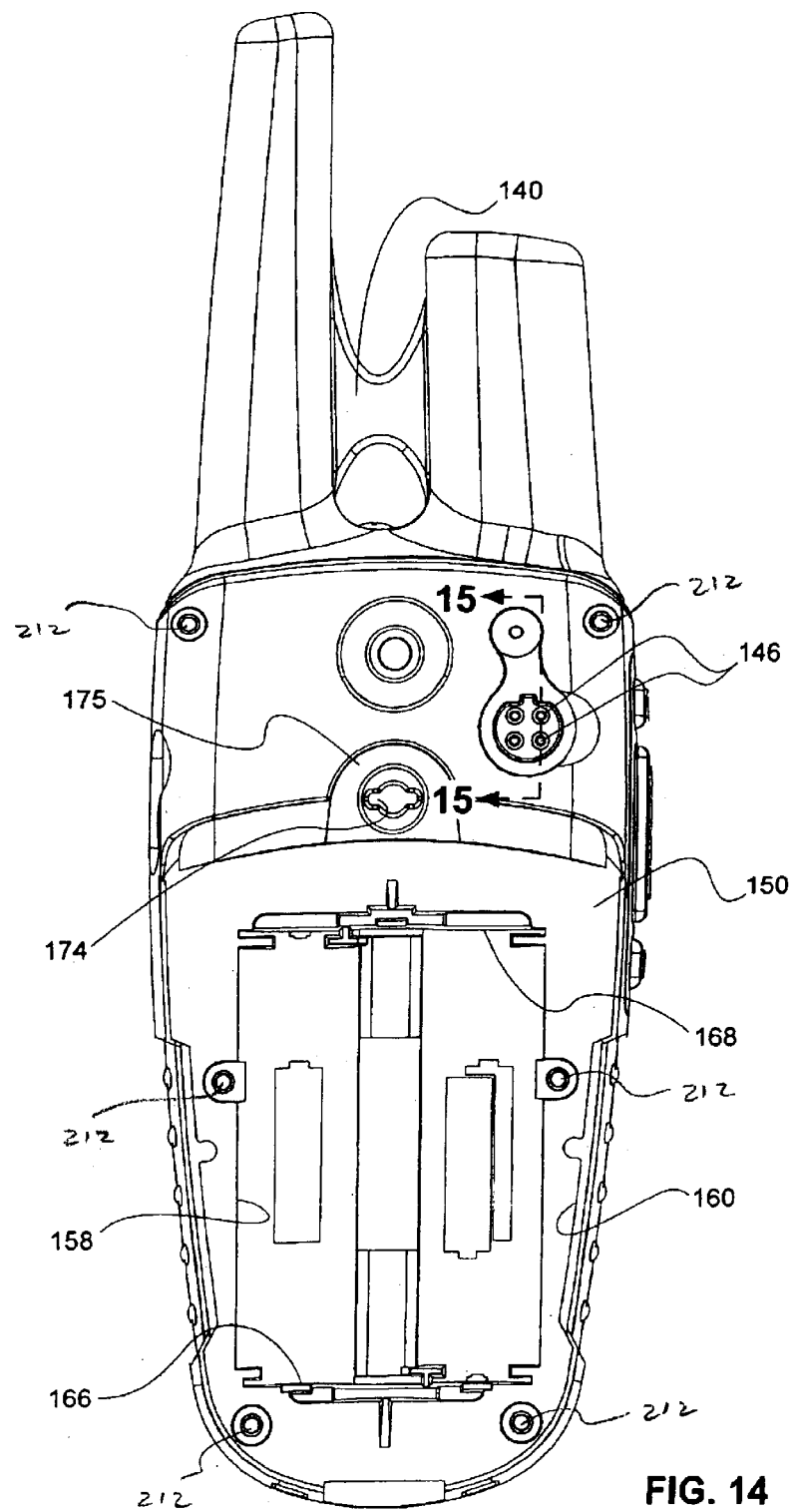
FIG. 14 is a rear elevational view of the second housing section of FIG. 8.

Referring now to FIGS. 9 and 14, also positioned on the rear wall 90 of the second housing section 38 is an electrical connector comprising a number of connector pins 146, e.g., brass connector pins. The connector pins 146 are configured to permit, for instance, downloading of additional cartographic data and the like through removable coupling with an external device (not shown). As best seen in FIGS. 8 and 15, positioned to correspond with the connector pins 146 is a cavity 148 in the exterior surface 150 of the rear wall 90 of the second housing section 38 (i.e., the surface of the rear wall 90 which is visible from the backside of the GPS/radio unit 10 when the GPS/radio unit 10 is assembled). The bottom surface 152 of the cavity 148 includes at least one opening 154 therein, the number of openings corresponding to the number of connector pins 146 desired. Fitted into each opening 154 in an interference fit is a connector pin 146. Alternatively, the connector pins 146 may be molded into the second housing section 38. Each connector pin 146 is positioned such that a portion thereof extends into the internal compartment of the GPS/radio unit 10 and a portion thereof extends into the cavity 148 in the exterior surface 150 of the rear wall 90. The interference fit of the connector pins 146 within openings 154 provides a certain degree of protection against ingress of water. However, to further ensure that water may not enter the internal compartment of the GPS/radio unit 10 through the opening(s) 154, a dot of RTV sealant may be applied at the location of the opening(s) 154 as discussed above with regard to the elongated slot 102 in the first side wall 92.

Figure 11:
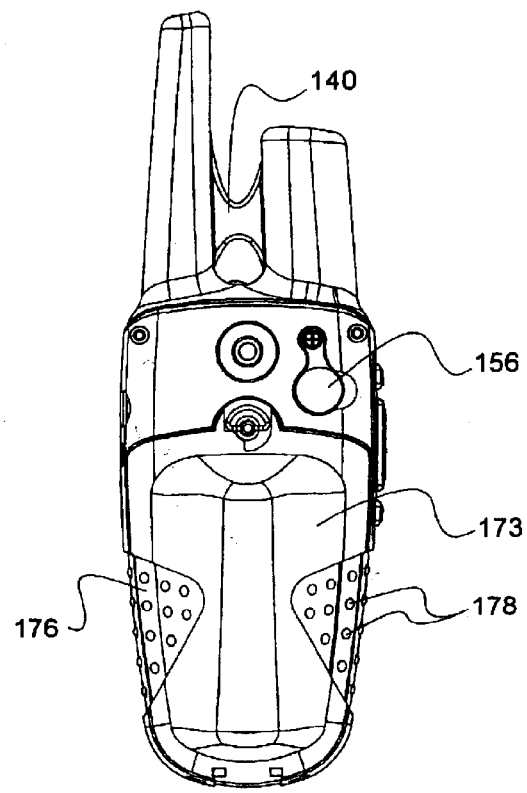
FIG. 11 is a rear elevational view of an exemplary assembled GPS/radio unit in accordance with the present invention.

As best seen in FIG. 11, when the connector pins 146 are not coupled with an external device (not shown), a cover 156 comprising a rubber or plastic plug) may be placed within the cavity 148 in the exterior surface 150 of the rear wall 90. The plug is primarily for aesthetics and may, incidentally, provide some protection for connector pins 146 against collection of debris and mechanical damage when the connector pins 146 are not coupled with an external device (not shown) and an adapter (not shown) for the external device (not shown) provides some protection when coupled with the connector pins 146.

Figure 10:
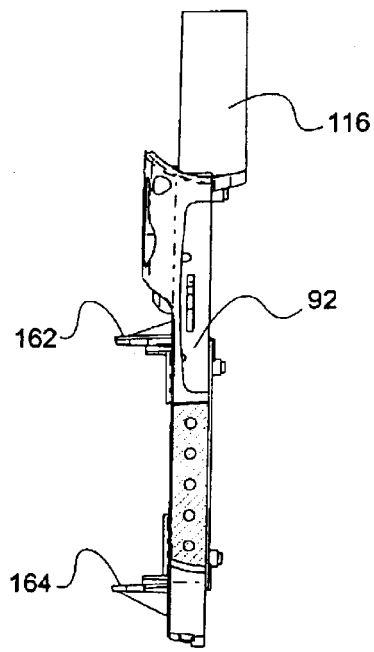
FIG. 10 is a right side elevational view of the second housing section of FIG. 8.

Referring now to FIGS. 8 and 14, the exterior surface 150 of the rear wall 90 also includes two elongated, parallel depressions 158, 160 sized and shaped to receive a pair of batteries (not shown) for powering the GPS/radio unit 10. Positioned to correspond with the parallel depressions 158, 160 is a top protruding wall 162 and a bottom protruding wall 164 to aid in holding the batteries (not shown) in place within the depressions 158, 160 (FIG. 10). At opposing longitudinal ends of each depression 158, 160 is a pair of battery terminals 166, 168, each battery terminal 166, 168 (FIG. 14) having associated therewith a corresponding opening 170, 172 (FIGS. 9 and 12) into the internal compartment of the GPS/radio unit 10. To ensure that water may not enter the internal compartment through the battery terminal openings 170, 172, a dot of RTV sealant is applied at the locations of the openings 170, 172 as discussed above with regard to the elongated slot 102 in the first side wall 92.

Figure 12:
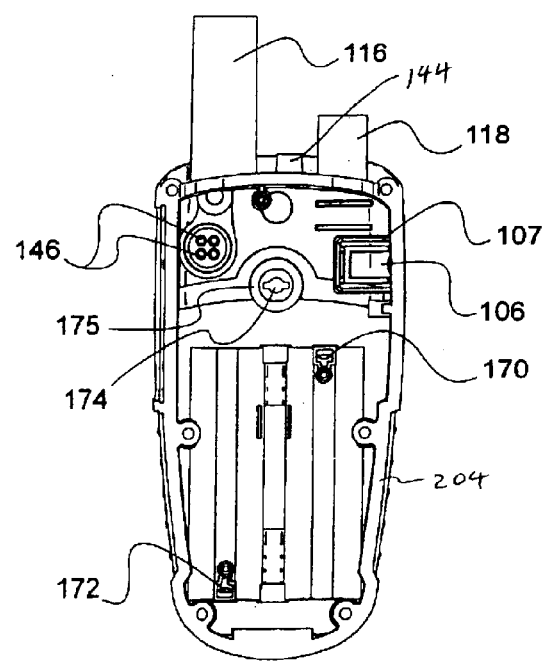
FIG. 12 is a front elevational view of the second housing section of FIG. 8.

Once the batteries (not shown) are positioned within the parallel depressions 158, 160, a battery cover 173 (FIGS. 11 and 16) is positioned over the batteries and the top and bottom protruding walls 162, 164. Battery covers are known to those of ordinary skill in the art and, accordingly, the structure of the battery cover will not be further discussed herein. To secure the battery cover 173 in place, the rear wall 90 of the second housing section 38 includes a slot opening 174 therein surrounded by an annular ridge 175, the slot opening 174 sized and shaped to receive a corresponding protrusion (not shown) on the battery cover 173 (FIGS. 9, 12 and 14). To secure the battery cover 173 in place, the protrusion (not shown) is inserted into the slot opening 174 and rotated about one-quarter turn (i.e., about 90 degrees). When rotated in this manner, the protrusion (not shown) is prohibited from disengaging the rear wall 90 of the second housing section 38 and, thus, the battery cover 173 is held in place. Such locking mechanisms are known to those of ordinary skill in the art and will not be further discussed herein.

To prevent water from entering the internal compartment of the GPS/radio unit 10 through the slot opening 174, a bead of RTV sealant is applied at the location of the slot opening 174 as discussed above with regard to the elongated slot 102 in the first side wall 92 to form a resilient gasket upon curing.

To assemble the waterproof GPS/radio unit 10 of the present invention, the first housing section 36 and the second housing section 38 are fitted together in a cooperatively mated relationship forming the internal compartment in which the internal electronic components of the GPS/radio unit 10 are enclosed. The first side wall 42 of the first housing section 36 is cooperatively mated with the first side wall 92 of the second housing section 38, the second side wall 44 of the first housing section 36 is cooperatively mated with the second side wall 94 of the second housing section 38, the bottom wall 46 of the first housing section 36 is cooperatively mated with the bottom end wall 95 of the second housing section 38 and the top wall 45 of the first housing section 36 is cooperatively mated with the top end wall 96 of the second housing section 38. This cooperative mating of the first and second housing sections 36, 38 is effected through contact of the elastomeric gasket 200 formed on the peripheral edge 202 of first housing section with polished flat comprising the surface of the peripheral edge 204 of the second housing section 38. Compression of elastomeric gasket 200, and specifically of seal bead 210, creates a water tight seal along the line of contact around the periphery of the GPS/radio unit 10 and between first and second housing sections 36, 38. First housing section 36 is secured to second housing section 38, and elastomeric gasket 200 compressed therebetween, by the use of six self-threading screws (not shown) extending through apertures 212 in second housing section 38 (FIG. 14) and into mutually aligned apertures 214 in bosses 216 in front housing section 36. When mated in this manner, the upwardly extending ridge 54 of the first housing section 36 and the upwardly extending ridge 93 of the second housing section 38 cooperate to form a cavity 99 into which the body portion 134 of the flexible elastomeric cover 132 is received.

Prior to assembly of the first housing section 36 with the second housing section 38, the flexible elastomeric cover 132 is positioned over the first, second and, optionally, third tubular structures 116, 118, 144 such that the first tubular structure 116 is received in the first tubular portion 136 of the flexible elastomeric cover 132, the second tubular structure 118 is received in the second tubular portion 138 of the flexible elastomeric cover 132, the third tubular structure 144 is appropriately aligned with flexible elastomeric cover 132 and the body portion 134 is received in the cavity 99. Flexible cover 132 is secured to second housing section 38 using an RTV adhesive, which adhesive also acts as a sealant to further ensure a watertight seal.

As seen in FIGS. 2, 16 and 17 and as previously described, an optional gripping region 176 may be formed such that it extends over a portion of the exterior surface 150 of the rear wall 90 of the second housing section 38, over a portion of the battery cover 173, over a portion of the exterior surface 48 of the front wall 40 of the first housing section 36, over a portion of the side walls 42, 44 of the first housing section 36 and over a portion of the side walls 92, 94 of the second housing section 38 as shown. The optional gripping region 176 may be formed, as previously noted, of an elastomer and may be secured to the first housing section 36 and the second housing section 38 as part of the molding thereof on those respective components. In the embodiment shown in FIGS. 2, 16 and 17, the material forming the gripping region 176 is received in a series of depressions 177 (best seen in FIG. 8) in the exterior surface 48 of the front wall 40 of the first housing section 36, the exterior surface 150 of the rear wall 90 of the second housing section 38, in the side walls 42, 44 of the first housing section 36 and the side walls 92, 94 of the second housing section 38. In this embodiment, the gripping region 176 is slightly recessed from the remainder of the portable, handheld GPS/radio unit 10. It will be understood and appreciated by those of ordinary skill in the art that the gripping region 176 may be flush with the remainder of the GPS/radio unit 10 or protrude therefrom and that such alternatives, as well as the complete omission of gripping region 176, are contemplated to be within the scope of the present invention. The gripping region 176 may include a number of bumps or protrusions 178 extending outwardly therefrom to assist a user in grasping the GPS/radio unit 10 without slippage.

The illustrated positioning of the user input 28, control buttons 86, 88 and "push to talk" button 100 is currently preferred as it permits ergonomic handling of the GPS/radio unit 10 and one-handed user operation. For example, in use, a user would grasp the GPS/radio unit 10 such that the exterior surface 150 of the rear wall 90 of the second housing section 38 and the battery cover 173 are adjacent the palm of the user's hand. The user's thumb would then be able to easily access and maneuver the user input 28 and the control buttons under elastomeric covers 86, 88 while the user's fingers would be positioned proximate the "push to talk" button 100 located on the first side wall 92 of the second housing section 38. Additionally, the user's hand would be in contact with the each gripping region 176 of the GPS/radio unit 10 and slippage thereof would be diminished.

When assembled as provided herein, the GPS/radio unit 10 of the present invention is capable of withstanding temporary immersion in water up to one meter deep. That is, ingress of water in quantities causing harmful effects to the internal electronic components of the GPS/radio unit 10 shall not be possible when the GPS/radio unit 10 is temporarily immersed in water up to one meter deep under standardized conditions of pressure and time, i.e., about 30 minutes. (The water depth is measured from the bottom of the GPS/radio unit 10 to the top surface of the water and assumes the GPS/radio unit 10 is in an upright orientation or service position.

While the GPS/radio unit 10 of the present invention has been disclosed herein in terms of an exemplary embodiment and variations thereof, those of ordinary skill in the art will recognize and appreciate that many other additions, deletions, and modifications of the disclosed embodiment may be effected without departing from the scope of the invention as hereinafter claimed. For instance, the positioning of the various control buttons, the type of user input utilized and the specific methods of waterproofing each delineated location of the GPS/radio unit 10 may be modified without departing from the scope hereof.

What is claimed is:

1. A waterproof combined global positioning system navigation unit and two-way radio communications unit (GPS/radio unit) configured for wirelessly communicating with at least one other such GPS/radio unit, the at least one other GPS/radio unit being configured to transmit radio signals indicative of that GPS/radio unit's location, the GPS/radio unit comprising:

a global positioning system receiver for receiving satellite signals from a plurality of satellites;

a processor coupled with the global positioning system receiver for calculating the location of the GPS/radio unit as a function of the received satellite signals;

a radio transceiver coupled with the processor for receiving the radio signals transmitted by the at least one other GPS/radio unit and for transmitting a radio signal to the at least one other GPS/radio unit, wherein the transmitted radio signal is indicative of a location of the GPS/radio unit, and wherein the processor is configured to identity the location of the at least one other GPS/radio unit based upon the received radio signals;

a display coupled with the processor for indicating the location of the at least one other GPS/radio unit; and a waterproof housing enclosing the global positioning system receiver, the processor, the radio transceiver and the display, the waterproof housing comprising a first housing section and a second housing section, wherein the second housing section is cooperatively coupled with the first housing section to create a watertight seal therewith, wherein one of the first housing section and the second housing section includes a peripheral edge carrying a continuous elastomeric gasket thereon, the other of the first housing section and the second housing section Includes a peripheral edge against which the continuous elastomeric gasket is compressed, and wherein the continuous elastomeric gasket Includes a continuous seal head protruding from a face thereof, the peripheral edge of the other of the first housing continuous seal head is compressed against the polished flat.

2. The waterproof GPS/radio unit of claim 1, wherein the first housing section includes a top wall and first and second side walls, and wherein a ridge extends upwardly from the top wall and the first and second side walls of the first housing section to create a first cavity portion, wherein the second housing section includes a top end wall and first and second side walls, the top end wall including at least first and second tubular structures protruding upwardly thereform, and wherein a ridge extends upwardly from the top end wall and the first and second side walls of the second housing section to create a second cavity portion, and wherein the cooperatively coupled first and second housing sections form a cavity from the first and second cavity portions.

3. the waterproof GPS/radio unit of claim 2, wherein the waterproof housing further comprises a cover having a body portion and at least first and second tubular cover portions, wherein the first tubular cover portion covers the first tubular structure, the second tubular cover portion covers the second tubular structure and at least a portion of the body portion of the cover is received in the cavity.

4. The waterproof GPS/radio unit of claim 3, wherein each of the at least first and second cover tubular portions Includes an annular protrusion on an interior thereof sized to compressibly contact an exterior surface of a tubular structure covered thereby.

5. The waterproof GPS/radio unit of claim 2, further comprising a global positioning system antenna and a radio antenna.

6. The waterproof GPS/radio unit of claim 5, wherein the first tubular structure receives the global positioning system antenna and the second tubular structure receives the radio antenna.

7. The waterproof GPS/radio unit of claim 1, wherein at least one of the first and second housing sections includes at least one opening therein, and wherein the at least one opening is sealed to substantially prevent the ingress of water therethrough.

8. The waterproof GPS/radio unit of claim 7, wherein the at least one opening is sealed with a curable, liquid sealant.

9. The waterproof GPS/radio unit of claim 8, wherein the curable, liquid sealant comprises a room temperature vulcanizing sealant.

10. The waterproof GPS/radio unit of claim 7, wherein at least one member extends through the at least one opening, and wherein the curable, liquid sealant is disposed about the member to seal the at least one opening.

11. The waterproof GPS/radio unit of claim 10, wherein the curable, liquid sealant comprises a room temperature vulcanizing sealant.

12. A waterproof housing for a combined global positioning system navigation unit and two-way radio communications unit (GPS/radio unit) capable of wirelessly communicating with at least one other such GPS/radio unit, the at least one other BPS/radio unit being configured to transmit radio signals indicative of that GPS/radio units location, the waterproof housing comprising:

a first housing section;

a second housing section cooperatively coupled with the first housing section to create a watertight seal therewith;

wherein one of the first housing section and the second housing section includes a peripheral edge carrying a continuous elastomeric gasket thereon, the other of the first housing section and the second housing section includes a peripheral edge against which the continuous elastomeric gasket is compressed; and wherein the continuous elastomeric gasket includes a continuous seal head protruding from a face thereof the peripheral edge of the other of the first housing section and second housing section comprises a polished flat and the continuous seal bead is compressed against the polished flat.

13. The waterproof housing of claim 12, wherein the first housing section includes a top wall and first and second side walls, and wherein a ridge extends upwardly from the top wall and the first and second side walls of the first housing section to create a first cavity portion, wherein the second housing section includes a top end wall and first and second side walls, the top end wall Including at least first and second tubular structures protruding upwardly therefrom, and wherein a ridge extends upwardly from the top end wall and the first and second side walls of the second housing section to create a second cavity portion, and wherein the cooperatively coupled first and second housing sections form a cavity from the first and second cavity portions.

14. The waterproof housing of claim 13, further comprising a cover having a body portion and at least first and second tubular cover portions, wherein the first tubular cover portion covers the first tubular structure, the second tubular cover portion covers the second tubular structure and at least a portion of the body portion of the cover is received in the cavity.

15. The waterproof housing of claim 14, wherein each of the at least first and second cover tubular portions includes an annular protrusion on an interior thereof sized to compressibly contact an exterior surface of a tubular structure covered thereby.

16. The waterproof housing of claim 12, wherein at least one of the first and second housing sections includes at least one opening therein, and wherein the at least one opening is sealed to substantially prevent the ingress of water therethrough.

17. The waterproof housing of claim 16, wherein the at least one opening is sealed with a curable, liquid sealant.

18. The waterproof housing of claim 17, wherein the curable, liquid sealant comprises a room temperature vulcanizing sealant.

19. The waterproof housing of claim 16, wherein at least one member extends through the at least one opening, and wherein the curable, liquid sealant is disposed about the member to seal the at least one opening.

20. The waterproof housing of claim 19, wherein the curable, liquid sealant comprises a room temperature vulcanizing sealant.

21. A method for substantially waterproofing a combined global positioning system navigation unit and two-way radio communications unit (GPS/radio unit), comprising:

disposing a GPS/radio unit that Is configured for wirelessly communicating with at least one other such GPS/radio unit at least partially within a housing section having at least one opening therein; and sealing the at least one opening to substantially prevent the ingress of water therethrough;

wherein sealing the at least one opening to substantially prevent the ingress of water therethrough comprises placing another housings section having a peripheral edge cooperatively configured for continuous contact with a continuous contact and effecting a continuous sent between the housing section and the another housing section;

forming a continuous elastomeric gasket along the peripheral edge of one of the housing section and the another housing section, and compressing the continuous elastomeric gasket between the housing section and the another housing section;

forming the continuous elastomeric gasket comprises forming a seal bead protruding from a surface of the continuous elastomeric gasket and compressing the seal bead; and configuring the peripheral edge of another of the housing section and the another housing section as a flat and compressing the seal head against the flat.

22. The method of claim 21, wherein disposing the GPS/radio unit at least partially within a housing section having at least one opening therein comprises disposing a GPS/radio unit at least partially within a housing section having a display opening thin sized and shaped for viewing a display therethrough.

23. The method of claim 22, wherein sealing the at least one opening to substantially prevent the ingress of water therethrough comprises:

providing a transparent lens for covering the display opening; and sealing the transparent lens proximate a periphery thereof to an exterior surface of the housing over the display opening such that the ingress of water through the display opening is substantially prevented.

24. The method of claim 21, wherein disposing the GPS/radio unit at least partially within a housing section having at least one opening therein comprises disposing a GPS/radio unit at least partially within a housing section having an audio jack compartment, the audio jack compartment having an associated opening through the wall of the housing section.

25. The method of claim 24, wherein sealing the opening to substantially prevent the ingress of water therethrough comprises applying a curable liquid sealant to the at least one opening associated with the audio jack compartment and curing the curable liquid sealant to create a water tight seal for substantially preventing the ingress of water through the at least one opening associated with the audio jack compartment.

26. The method of claim 25, wherein applying the curable liquid sealant to the at least one opening associated with the audio jack comprises applying a room temperature vulcanizing sealant to the at least one opening associated with the audio jack.

27. The method of claim 21, wherein disposing the GPS/radio unit at least partially within a housing section having at least one opening therein comprises disposing a GPS/radio unit at least partially within a housing section having a flex circuit slot therein sized and shaped for receiving a flex circuit therethrough.

28. The method of claim 27, wherein sealing the opening to substantially prevent the ingress of water therethrough comprises applying a curable liquid sealant to the flex circuit slot and curing the curable liquid sealant to create a water tight seal for substantially preventing the ingress of water through the flex circuit slot.

29. The method of claim 28, wherein applying the curable liquid sealant to the flex circuit slot comprises applying a room temperature vulcanizing sealant to the flex circuit slot.

30. The method of claim 21, wherein disposing the (GPS/radio unit at least partially within a housing section having at least one opening therein comprises disposing a GPS/radio unit at least partially within a housing section having an electrical connector, the electrical connector having at least one associated opening through the wall of the housing.

31. The method of claim 30, wherein scaling the opening to substantially prevent the ingress of water therethrough comprises applying a curable liquid sealant to the at least one opening associated with the electrical connector and curing the curable liquid sealant to create a water tight seal for substantially preventing the ingress of water through the at least one opening associated with the electrical connector.

32. The method of claim 31, wherein applying the curable liquid sealant to the at least one opening associated with the electrical connector comprises applying a room temperature vulcanizing sealant to the at least one opening associated with the electrical connector.

33. The method of claim 21, wherein disposing the GPS/radio unit at least partially within a housing having at least one opening therein comprises disposing a GPS/radio unit at least partially within a housing having at least one battery terminal, the at least one battery terminal having an associated opening through the wall of the housing section.

34. The method of claim 33, wherein sealing the opening to substantially prevent the ingress of water therethrough comprises applying a curable liquid sealant to the at least one opening associated with the at least one battery terminal and curing curable liquid sealant capable to create a water tight seal for substantially preventing the ingress of water through the at least one opening associated with the at least one battery terminal.

35. The method of claim 34, wherein applying the curable liquid sealant to the at least one opening associated with the at least one battery terminal comprises applying a room temperature vulcanizing sealant to the at least one opening associated with the at least one battery terminal.

36. The method of claim 21, wherein disposing the GPS/radio unit at least partially within a housing section having at least one opening therein comprises disposing a GPS/radio unit at least partially within a housing section having at least one battery cover slot, the battery cover slot having an associated opening through the wall of the housing section.

37. The method of claim 36, wherein sealing the opening to substantially prevent the ingress of water therethrough comprises applying a curable liquid sealant to the opening associated with the battery cover slot and curing the curable liquid sealant to create a water tight seal for substantially preventing the ingress of water through the opening associated with the battery cover slot.

38. The method of claim 37, wherein applying the curable liquid sealant to the opening associated with the battery cover slot comprises applying a room temperature vulcanizing sealant to the opening associated with the battery cover slot.

39. The method of claim 21, wherein disposing the GPS/radio unit at least partially within a housing section having at least one opening therein comprises disposing a GPS/radio unit at least partially within a housing section having at least one control button opening therein sized and shaped for permitting a control button to extend therethrough.

40. The method of claim 39, wherein scaling the at least one opening to substantially prevent the ingress of water therethrough comprises:

providing a flexible, elastomeric cover having a body portion sized and shaped for receiving the control button and a flange portion; and securing the flange portion of the flexible, elastomeric cover to a groove on an interior surface of the housing in a resilient, compressed interference fit.

41. The method of claim 21, wherein disposing the GPS/radio unit at east partially within a housing section having at least one opening therein comprises disposing a GPS/radio unit at least partially within a housing section having at least one opening for passage of sound therethrough.

42. The method of claim 41, wherein sealing the at least one opening to substantially prevent the ingress of water therethrough comprises:

positioning an air and sound-permeable, water-impermeable membrane over the at least one opening for passage of sound therethrough on an interior surface of the housing section; and scaling a periphery of the air and sound-permeable, water-impermeable membrane to the interior surface of the housing section surrounding the at least one opening for passage of sound therethrough.

43. The method of claim 41, wherein the at least one opening for passage of sound therethrough comprises a plurality of openings, and wherein sealing the at least one opening to prevent the ingress of water therethrough comprises:

positioning a sealing element against an interior surface of the housing section with the sealing element surrounding the plurality of openings;

providing a sound transmission device including a water-impermeable membrane over the plurality of openings; and mechanically clamping the water-impregnable membrane of the sound transmission device to the housing section with the sealing element compressed therebetween.

44. The method of claim 21, further including polishing the flat.

45. The method of claim 21, wherein forming the elastomeric gasket comprises injection molding the elastomeric gasket onto the one of the housing section and the another housing section.

46. The method of claim 21, wherein sealing the at least one opening to substantially prevent the ingress of water therethrough comprises molding an elastomeric cover over the at least one opening.

47. A method of forming a substantially waterproof enclosure for an electronic communications device, comprising:

molding a first housing section defining a cavity and having a peripheral edge;

molding a second housing section defining a cavity and having a peripheral edge cooperatively configured for continuous contact with the peripheral edge of the first housing section;

molding a continuous elastomeric gasket along one of the peripheral edge of the first housing section and the peripheral edge of the second housing section;

placing the first housing section and the second housing section with their respective peripheral edges in mutual alignment and compressing the continuous elastomeric gasket therebetween;

wherein molding the continuous elastomeric gasket comprises forming a seal bead protruding from surface of continuous elastomeric gasket and wherein compressing the gasket comprises compressing the seal bead; and configuring the peripheral edge of one of the first housing section and the second housing section as a flat and compressing the seal bead against the flat.

48. The method of claim 47, further including polishing the flat.

49. The method of claim 47, wherein molding of the first housing section, the second housing section and the elastomeric gasket comprises injection molding.

50. The method of claim 49, wherein injection molding of the elastomeric gasket is effected in a different mold than injection molding of the first housing section.

* * * * *